United States Patent
Tsironis (10) Patent No.: US 12,379,397 B1
(45) Date of Patent: Aug. 5, 2025

(54) LOAD PULL TUNER ON WAVEGUIDE WAFER-PROBE

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 203 days.

(21) Appl. No.: 18/221,433

(22) Filed: Jul. 13, 2023

(51) Int. Cl.
  G01R 1/26 (2006.01)
  G01R 1/067 (2006.01)
  G01R 27/32 (2006.01)
  G01R 31/28 (2006.01)

(52) U.S. Cl.
  CPC .......... G01R 1/06772 (2013.01); G01R 1/26 (2013.01); G01R 27/32 (2013.01); G01R 31/2822 (2013.01)

(58) Field of Classification Search
  CPC ............ G01R 1/07378; G01R 1/06755; G01R 27/32; G01R 31/28; G01R 35/00; H01P 3/023; H01P 5/08; H01P 5/04
  See application file for complete search history.

(56) References Cited

U.S. PATENT DOCUMENTS

| | | | |
|---|---|---|---|
| 5,910,754 A | 6/1999 | Simpson | |
| 6,674,293 B1 | 1/2004 | Tsironis | |
| 7,053,628 B1 | 5/2006 | Tsironis | |
| 11,125,777 B1 * | 9/2021 | Tsironis | G01R 27/06 |
| 11,733,280 B1 * | 8/2023 | Tsironis | H01P 5/04 324/601 |
| 11,867,736 B1 * | 1/2024 | Tsironis | G01R 31/2822 |

OTHER PUBLICATIONS

"Load Pull Measurements" [online], Wikipedia [retrieved on Nov. 18, 2016] Retrieved from Internet <URL: http://en.wikipedia.org/wiki/Load_pull>.
W Band Programmable Tuner Model 11075, Product Note PN-43, Focus Microwaves, Aug. 1997.
"5 Challenges for Probe Tip Sub-THz Measurements" [online], FormFactor [retrieved on Feb. 28, 2023] Retrieved from Internet <URL: www.formfactor.com/blog/ 2018/challenges-for-probe-tip-sub-thz-measurements/>.
"A Computer-Controlled Microwave Tuner for Automated Load Pull", Sechi F, et al., RCA Review, vol. 44, Dec. 1983, pp. 566-583, figure 5.
"Adapter Removal—Insertion" [online], Keysight [retrieved on Oct. 29, 2022] Retrieved from Internet < URL: E5061B (keysight.com)>.

* cited by examiner

Primary Examiner — Vinh P Nguyen (57) ABSTRACT

A computer-controlled load pull tuner is embedded in a quarter-circle waveguide-to-wafer-probe adapter and creates a compact and handy assembly. The tuner includes two, along the 90-degree arc of the waveguide, sliding carriages, each holding a tuning probe inserted at fixed penetration without cumbersome vertical axis mechanisms. The carriages holding the tuning probes are spring preloaded against the waveguide wall and can tilt, when hitting a stop, lifting the tuning probes out of the waveguide cavity, thus allowing for a low residual reflection and high transmission behavior. On top of full load pull capacity, the assembly can be used for instantaneous s-parameter measurement when the tuning probes are lifted. High-speed calibration and tuning algorithms allow efficient operation.

6 Claims, 12 Drawing Sheets

FIG. 3: Partly prior art

LOAD PULL TUNER ON WAVEGUIDE WAFER-PROBE

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL: http://en.wikipedia.org/wiki/Load_pull>
2. W Band Programmable Tuner Model 11075, Product Note PN-43, Focus Microwaves, August 1997.
3. Tsironis C., U.S. Pat. No. 6,674,293, "Adaptable Pre-Matched Tuner System and Method".
4. Simpson G., et al., U.S. Pat. No. 5,910,754, "Reduced height waveguide tuner for impedance matching", FIG. 8.
5. "5 Challenges for Probe Tip Sub-THz Measurements" [online], FormFactor [retrieved on Feb. 28, 2023] Retrieved from Internet <URL: www.formfactor.com/blog/2018/challenges-for-probe-tip-sub-thz-measurements/>
6. "A Computer-Controlled Microwave Tuner for Automated Load Pull", Sechi F, et al., RCA Review, Vol 44, December 1983, pp. 566-583, FIG. 5.
7. Tsironis, C.: U.S. Pat. No. 7,053,628, "High reflection microwave tuner using metal-dielectric probe and method".
8. "Adapter Removal-Insertion" [online], Keysight [retrieved on Oct. 29, 2022] Retrieved from Internet <URL: E5061B (keysight.com)>

BACKGROUND OF THE INVENTION

This invention relates to load and source pull testing of millimeter-wave transistors and amplifiers using remotely controlled electro-mechanical waveguide impedance tuners.

Figure 1:
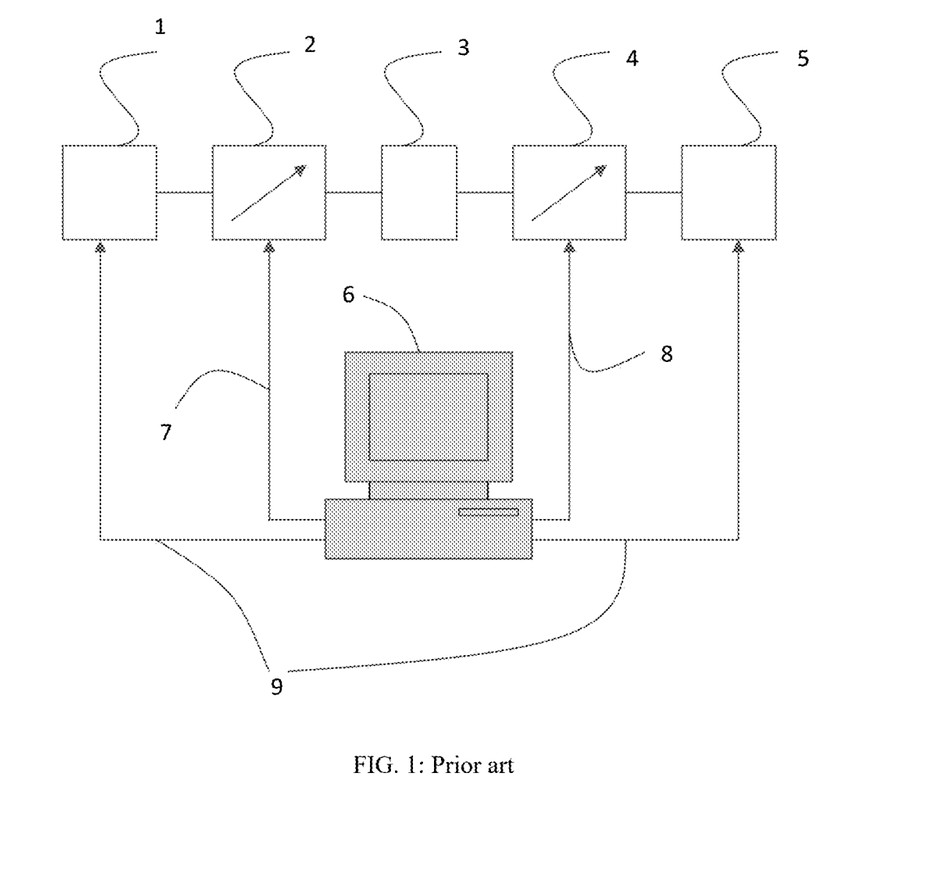
FIG. 1 depicts prior art: a typical generic automated load pull test system.

A popular method for testing and characterizing millimeter-wave transistor chips in their non-linear region of operation is "load pull" (see ref. 1). Load pull is a semiconductor device (transistor) characterization technique employing automatic microwave impedance (load-pull) tuners and other millimeter-wave test equipment as shown in FIG. 1. The waveguide tuners 2, 4 (see ref. 2) are used in order to manipulate the microwave impedance conditions under which the Device Under Test (DUT, or transistor, 3) is tested; the stimulus test signal is provided by a signal source 1 and the out-coming power is measured by a power meter 5; the whole is controlled by a PC controller 6, which includes an electronic digital interface to communicate with the instruments 1, 5 and the tuners 2, 4 using control and communication cables 7, 8 and 9.

DESCRIPTION OF PRIOR ART

Figures 2A, 2B:
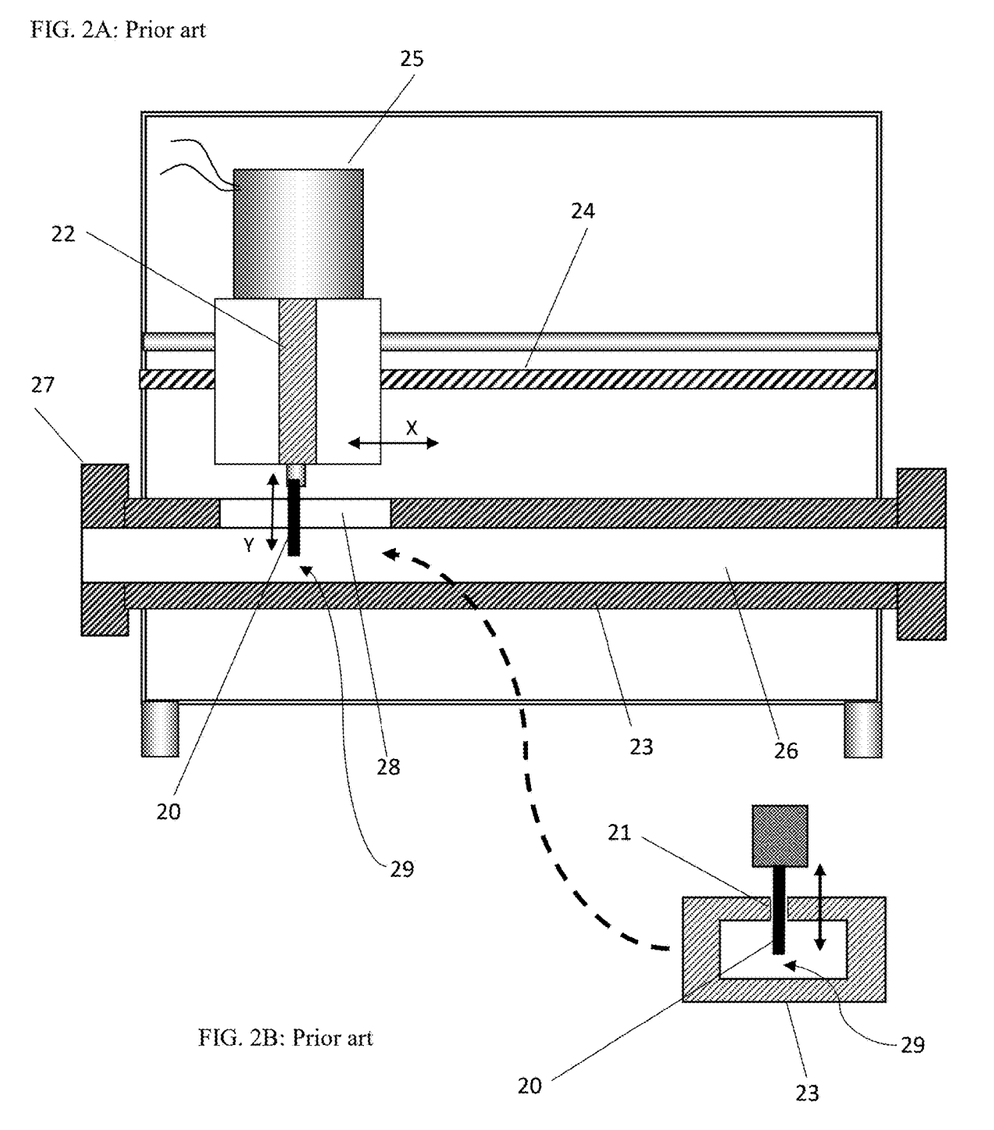
Figure 3:
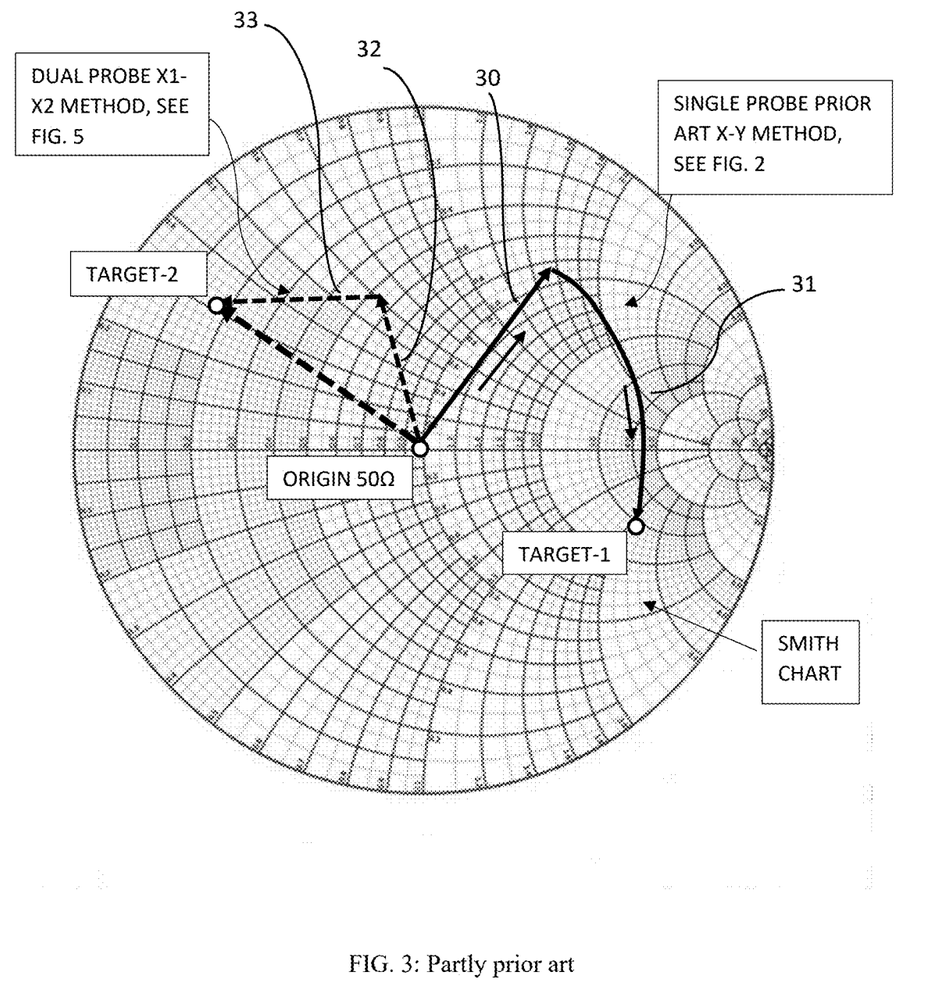
FIG. 3 depicts partly prior art: a Smith chart and two possible trajectories of impedance synthesis (tuning) to reach a target impedance starting from the origin of 50Ω. Reaching TARGET-1 uses the prior art single-probe technique with horizontal and vertical control; reaching TARGET-2 uses the new two-probe method with horizontal-only and without vertical control.

Waveguide impedance tuners include, in general, a low-loss waveguide transmission line 26, FIG. 2A, and one (see ref. 2) or more (see ref. 3) conductive tuning element(s) (tuning probe(s), 20) inserted in a slot 28 machined into the waveguide 23 parallel to its longitudinal axis; the probe 20 is a, at least partly, conductive rod, block, pellet or stub, is attached to a complex, high precision, adjustable vertical axis 22, controlled by a stepper motor 25 and is inserted vertically into the slot 28 machined into the broad wall of the waveguide and moved along the axis of the waveguide using a gear such as an ACME screw 24; this horizontal and vertical movement of the tuning probe creates, in a certain frequency range, a controllable variable reactance, which allows the synthesis of various impedances (or reflection factors) which are present at the test port 27, covering the quasi totality of the Smith chart (the polar impedance mapping display shown as normalized reflection factor, FIG. 3). The prior art impedance synthesis using tuning probe 20 follows path 30, 31 between the matched load at the origin (50Ω) of the Smith chart and an arbitrary reflection factor TARGET-1. Inserting the tuning probe into the slot creates a controlled reflection following path 30 and moving the probe along the slot controls the phase following path 31. The relation between reflection factor Γ and impedance Z is given by $\Gamma=(Z-Zo)/(Z+Zo)$, wherein $Z=R+jX$ and wherein Zo is the characteristic impedance. A typical value used for Zo is 50Ω.

When conductive tuning probes (typically metallic or metalized rods) 20, FIG. 2, penetrate the waveguide 26, they capture and deform the electric field, which is then concentrated in the area 29 between the bottom tip of the probe 20 and the ground plane 23 of the waveguide. This field deformation creates a capacitive effect, sends injected signal power back, and allows generating high and controllable reflection factors. The main disadvantage of this embodiment is the requirement for high precision and resolution and, by consequence, tall and cumbersome vertical probe movement mechanisms 22, see ref. 4, which must be very precise, especially when the probe is at maximum depth, very close to the bottom of the waveguide but also over the entire travel range; because of a hyperbolic behavior of the capacitance created, since the significant portion of reflection occurs when the probe tip is very close to the bottom inner wall of the waveguide (ground plane) and because the vertical movement resolution is constant over the entire travel, the high resolution and accuracy needed close the Gamma Max is obligatory the same over the whole travel. This movement process slows down the tuning procedure for these two reasons: (a) when the probe is withdrawn, the vertical movement is lengthy and much less effective in terms of generating useful reflection factor increments, and (b), since the vertical moving resolution must be constant, enhanced positioning accuracy and resolution are required all the way due to high tuning sensitivity in the high reflection area, when the probe is deeply inserted and close to the ground plane.

Related prior art (see ref. 4) does not teach waveguide to wafer-probe adapters including impedance tuners with two fixed penetration (or vertical position) tuning probes, having the capacity of wideband neutral low reflection state; since a fixed penetration probe creates a fixed reflection, its effect is only possible to cancel by an equal second probe a quarter wavelength away and at a single frequency. Prior art tuners require at least one high precision complex vertical axis to be able to tune along path 30-31 in FIG. 3.

BRIEF SUMMARY OF THE INVENTION

Figure 10:
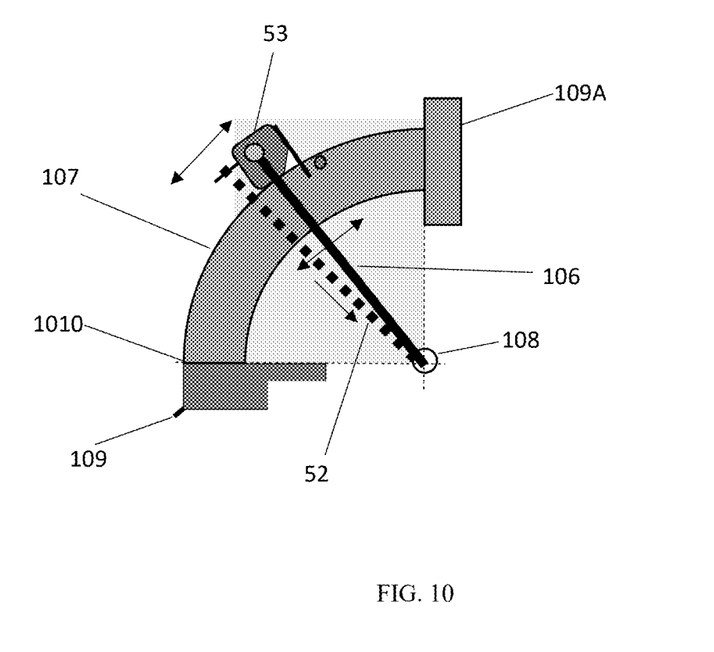
FIG. 10 depicts details of the rotation mechanics of the carriages sliding on the waveguide arc.

The invention discloses a first of a kind integration of load pull tuner and wafer-probe to waveguide adapter (see ref. 5), see FIG. 10, and associated calibration and tuning procedures. The tuner uses, other than the totality of the prior art, a horizontal-only (in this case peripheral only) movement mechanism of the permanently inserted tuning probes but can also be configured remotely to a minimum wideband reflection "initialization" state previously unknown in such structures (see ref. 6 and 7).

Figure 5A:
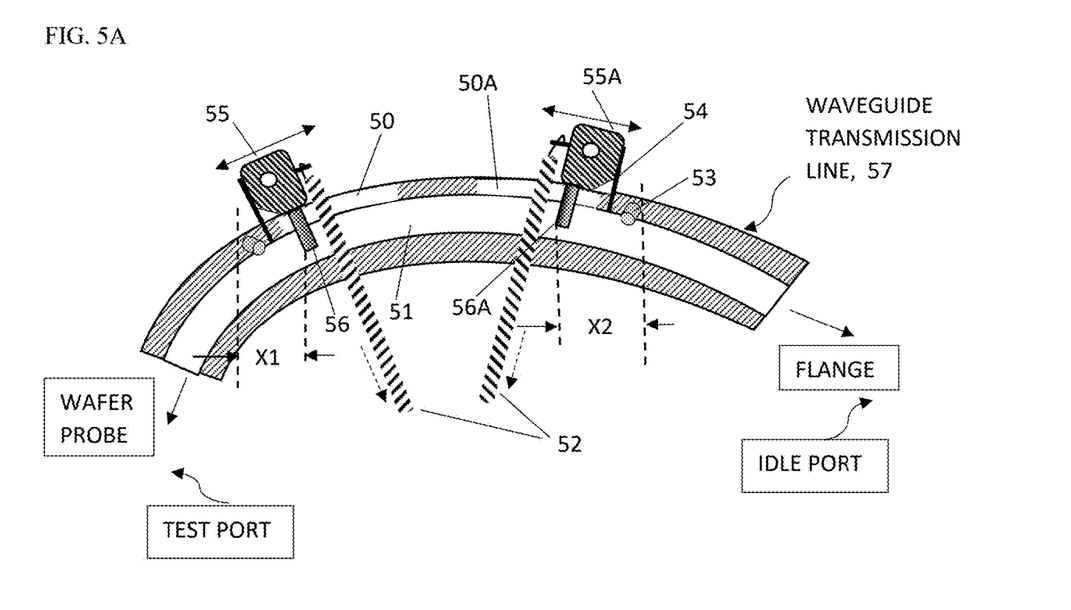
Figure 5B:
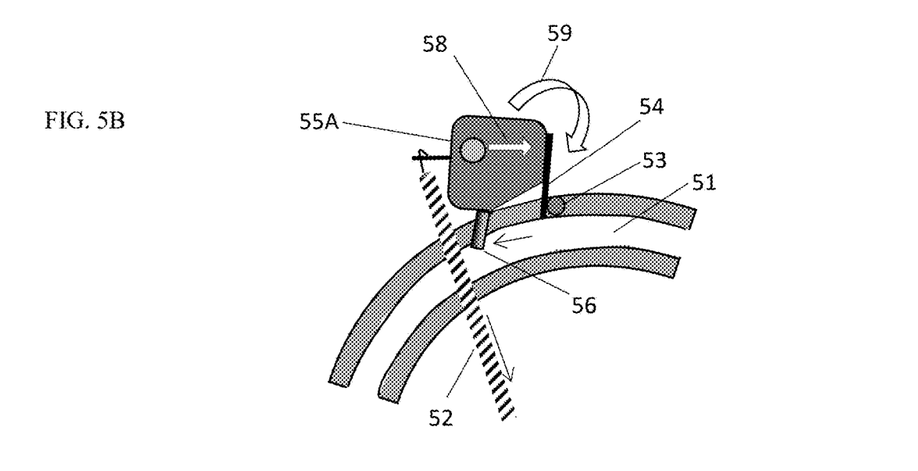
FIG. 5B depicts the detail of one probe and the tilting mechanism.
Figure 12:
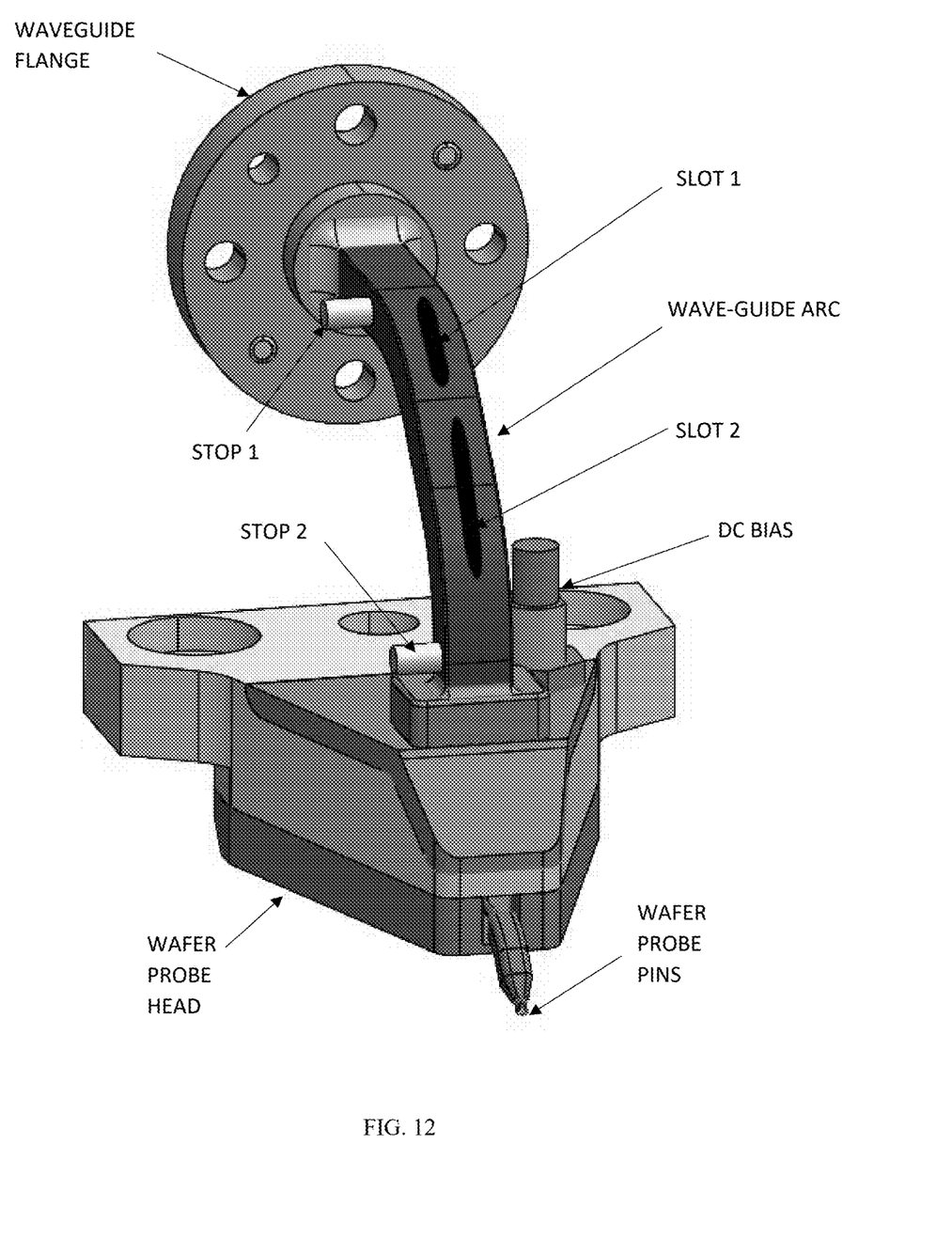
FIG. 12 depicts a commercially available waveguide-to-wafer-probe (WG2WP) adapter and the required modifications to incorporate the two fixed-penetration-tuning-probe load pull tuner.

The impedance tuner itself, of which a conceptual cross section is shown in FIGS. 5A and 5B, uses a low loss waveguide transmission line 57 and two tuning probes 56 and 56A. The tuning probes are, typically, at least partially conductive rods or pellets and are mounted on mobile carriages 55, 55A, inserted in slots 50 and 50A and slide along the waveguide transmission line arc. The carriages slide seamlessly and precisely along the waveguide arc wall guided by high precision slides. The carriages hold the partly conductive tuning probes (dielectric rods or pellets) 56, 56A and keep them inserted into the waveguide cavity at a fixed depth through the vertical slots 50, 50A in a non-contacting relationship with the slot walls 21 as shown in FIG. 2. The slots run parallel to the axis of the waveguide (FIG. 12). This tuning mechanism does not require any vertical tuning probe control. A medium size reflection (S11≈0.5-0.7) is created by either tuning probe at the test port of the waveguide, the port 1010 connected to the wafer probe body leading to the new tuning mechanism as shown in FIG. 3 (traces 32, 33). Both tuning mechanisms shown in FIG. 3 perform the same tuning objective: starting from the matched load (50Ω) they allow tuning to TARGETS-1 or -2. The result is the same, only the control mechanisms differ.

The carriage 53 is controlled using electric stepper motors and gear rotating the radial arm 106 (FIG. 10), which moves the carriage 53 along the arc 107 around the virtual center 108 of the arc 107; Last, not least, the tuning mechanism, liberated from cumbersome and expensive high resolution vertical probe control and movement delays, benefits also from inherent lower tuning error sensitivity to mechanical probe positioning tolerances close to $|\Gamma|\approx 1$

BRIEF DESCRIPTION OF THE SEVERAL VIEWS OF THE DRAWINGS

The invention and its mode of operation will be better understood from the following detailed description when read with the appended drawings, in which:

FIGS. 2A through 2B depict prior art: a single probe waveguide impedance tuner; FIG. 2A depicts a front view of the entire tuner; FIG. 2B depicts a cross section of the tuning probe (typically a conductive rod) entering the waveguide slot.

FIGS. 5A through 5B depict the basic mechanism of the load pull tuner embedded in the waveguide to wafer-probe adapter; FIG. 5A depicts the two-probe tuner.

DETAILED DESCRIPTION OF THE INVENTION

Figure 4:
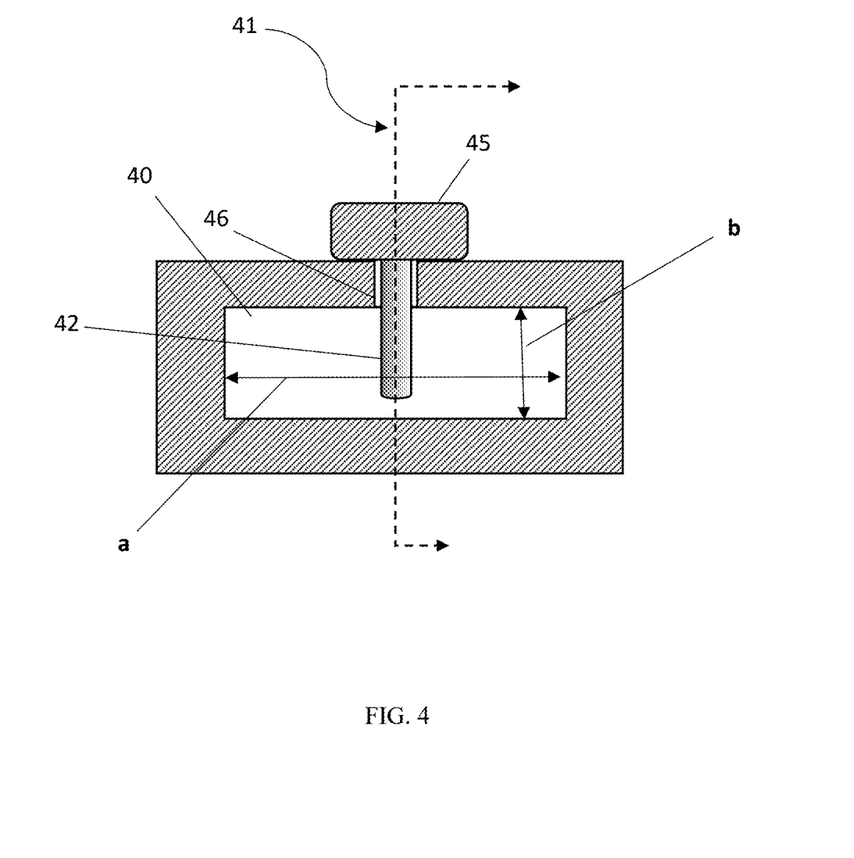
FIG. 4 depicts a cross-section through a waveguide with constant penetration conductive tuning rods (probes) entering contactless into vertical slots.

This invention discloses a high frequency (millimeter wave) waveguide-to-wafer-probe (WG2WP) adapter assembly with embedded and calibrated computer-controlled load-pull impedance tuner, suitable for noise and load pull measurements; if the tuning assembly is used at the input of the DUT it can be used for noise measurements, if it is used at the input and output of the DUT it can be used for source and load-pull. Since the commercially available probe heads in the WG2WP adapter include DC bias networks, full DC biasing and DUT (device under test, transistor) load and source pulling is straight forward. A cross section of the waveguide and its cavity 40 with the slot 46 and the reflective tuning probe 42 is shown in FIG. 4; the tuning probe 42 is attached to the mobile carriage 45, which slides seamlessly parallel to the top wall of the waveguide using a slider. Cross section 41 helps understanding the images in FIGS. 5A and 5B.

A commercially available WG2WP adapter is shown in FIG. 12; it shows the waveguide arc, the wafer-probe head with the wafer-probe pins, the DC bias socket, and the waveguide flange 109A. It also shown the two slots machined on the top broad wall of the waveguide arc and the two stops mounted perpendicularly on the narrow wall, to cause the tilting of the carriages and the lifting of the tuning probe from the slots as shown in FIG. 5B and initialize the tuner for reflection-free signal transmission and in-situ DUT s-parameter measurement. The tuning section integrated in the WG2WP adapter (FIG. 5A) uses the low loss waveguide transmission airline 51, which includes two broad top walls, two narrow sidewalls and two separate slots 50, 50A, cut into the broad wall along the waveguide. The horizontal control of carriages 55 and 55A can be made using stepper motors and a radial arm 106 (FIG. 10) which rotates, remotely controlled, around the virtual center 108 of the circle formed by the waveguide arc 107. To keep the moving carriages sliding seamlessly along the waveguide arc 107, they are spring-loaded against the waveguide top wall trajectory using a spring 52, as also shown in FIGS. 5A and 5B.

The tuning probe withdrawal is shown in FIG. 5B: when the carriage 55A moves 58 against the stop 53 and the lever 54 hits on it, the carriage 55A will tilt 59 against the pull of the spring 52 and will lift the tuning probe 56 outside of the slot 50A and the cavity 51. When the tuning probe is entirely withdrawn, then the associated position of the carriage is declared initial position of the specific carriage and the state of the controlling motor is declared and saved as Xi=0. The motor is instructed to return to this position when the tuner is initialized. This is equally valid for carriage #1 (55) and carriage #2 (55A). It is irrelevant if the carriages move in the same direction or opposite. The tuner would work the same if the stops were both towards the waveguide flange 109A or the wafer-probe head 1010, assuming that one of the carriages and the spring would be mirrored. The tuning and calibration routines would be equivalent by only replacing X with -X and turning the motors in opposite direction.

Figure 6:
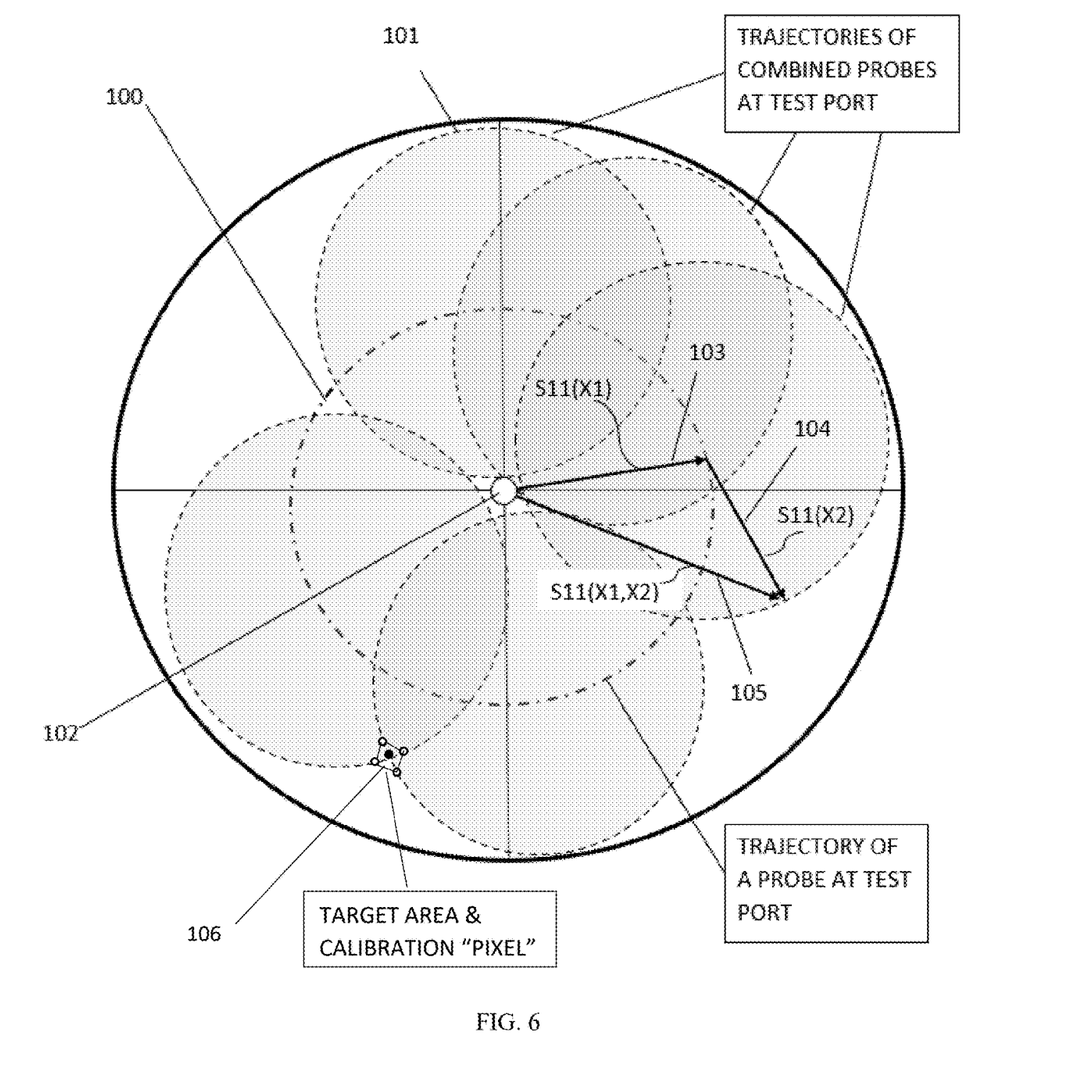
FIG. 6 depicts the impedance synthesis trajectories on the Smith chart using the two-probe impedance tuner with fixed probe insertion depth.

The tuning mechanism is demonstrated in FIG. 6: The total reflection factor 105 is the sum of a reflection vector on circle 100 of the first tuning probe, closest to the test port or the wafer-probe pins 109 (FIG. 10), around the center 102 of the Smith chart and a reflection vector on an epicycloid circle 101 of the second tuning probe rotating around points on the periphery of the first circle 100 i.e., the sum of all internal reflections in the waveguide and a function of the positions X1 and X2 of the two probes: S11(X1, X2) and is the vector-sum of the reflection factors 103 and 104 of both probes S11(X1) and S11(X2): S11(X1, X2)=S11(X1)+S11(X2), all referenced at the test port, which preferably is the plan of the wafer-probe pins 109 (FIG. 10). Since the magnitude of reflection of the first tuning probe 56, creating trace 100 (FIG. 6), is selected not to be maximum (i.e., |S11(X1)|≈0.6-0.7), there is a signal portion traversing the first tuning probe towards the secondary tuning probe 56A; this signal portion is then reflected back towards the primary tuning probe 56; again, a portion of this reflected back signal traverses the primary tuning probe 56 towards the test port and adds, as S11(X2) to the total reflection. The signal reflected at the secondary tuning probe 56A is also reflected at the primary tuning probe 56, and so on . . . creating the phenomenon of a multiple reflection. In mechanical terms this appears like turbulence. This back and forth bouncing of signal can be well described using signal flow graphs, but a mathematical description here is unnecessary, since the system and all its side-effects is calibrated as is. Overall FIG. 6 depicts schematically the reflection factor synthesis mechanism: each tuning probe creates at its own reference plane reflections $\Gamma_1$ or $\Gamma_2$, which are concentric reflection factor circles represented at test port reference plane as trace 100 on the Smith chart (FIG. 6). The total reflection factor traces 101 are created by a planetary epicycloid superposition of the two reflection factor vectors around the center 102 (one circle rotates around a point on the periphery of the other). The total reflection factor vector 105 is created by the vector sum of vector 103 (from the first tuning probe) and vector 104 (from the second tuning probe) as described above.

To be used in impedance synthesis the tuner must be calibrated and the calibration data must be used to generate the proper tuning probe positions to reach a TARGET impedance. In the following, since the tuning probe movement is controlled by stepper motors, it is convenient and meaningful to consider geometrical movements X (including XMAX) converted into motor steps. If the calibration data are saved in motor steps, then tuning occurs also in motor steps. To create a reasonable accuracy and tuning resolution, each tuning probe of the tuner must be characterized at least at 100 positions between X=0 and X=XMAX=λ/(2*step-size), even though any number is allowable; the step-size depends on the resolution of the associated control gear; the higher the frequency range the higher must be the resolution; in terms of a typical circular trajectory 100 (FIG. 6) a 360 degree rotation corresponds to steps of 3.6°; using $TE_{10}$ transmission mode in a waveguide class WR19 (Fmin=40 GHz) with internal dimensions of the cavity of a≈4.8 mm, b≈2.4 mm (FIG. 4) this corresponds to λ≈81 mm at 40 GHz and mechanical trajectory increments of ≈0.04 mm. To calibrate all 100×100=10,000 tuner states (calibration points) one would need at least 10,000 seconds or 2.8 hours, at 1 second delay per point. The new calibration method disclosed here allows reducing this time to approximately 200-250 seconds or 4 minutes.

A commercially available WG2WP adapter (see ref. 5), used as vehicle for the load pull tuner integration, is shown in FIG. 12. All items, the waveguide flange, the waveguide arc section, attached to the wafer-probe body (head), including the outline of the slots machined to receive the tuning probes and the associated stops, are clearly visible.

Figure 11:
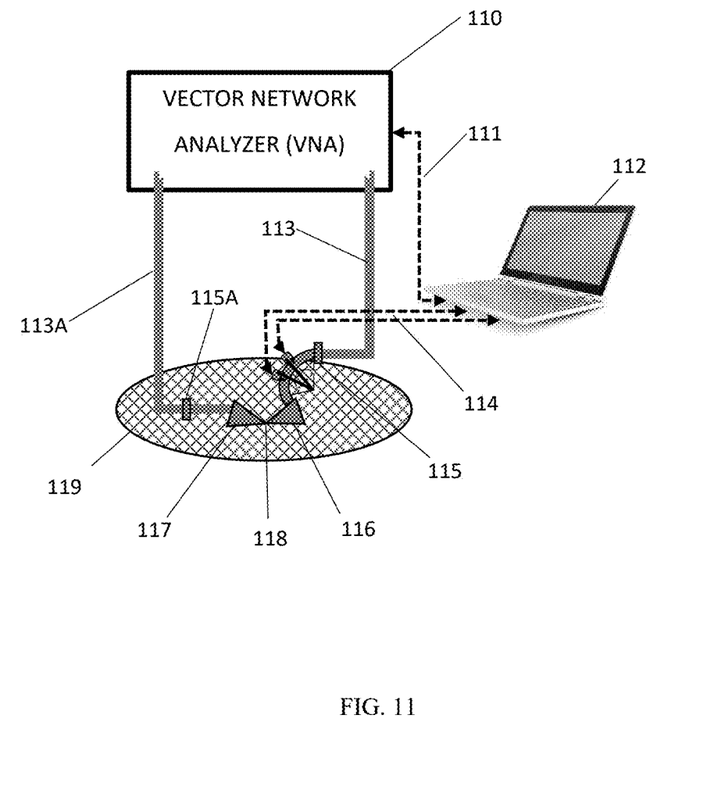
FIG. 11 depicts the calibration setup for the load pull tuner-waveguide-to-wafer-probe adapter assembly.

The calibration procedure executes in two steps after the WG2WP adapter is connected to a pre-calibrated vector network analyzer (VNA), FIG. 11; a mixed calibration must be used dealing with un-insertable adapters and cables, such as coaxial male-male, female-female adapters, coaxial-microstrip or, as here, wafer-probe to waveguide: one port (the test port) is a set of wafer-probe tips and the other port a waveguide flange. This type of calibration is possible using the adapter removal method (see ref. 8); the on wafer 119 calibration setup is shown in FIG. 11: the waveguide-to-wafer-probe adapter-tuner 115 is shown between the wafer-probe 116 and the waveguide flange 115, controlled by the PC 112 using digital cables 114; the calibration is not straight forward because the tuner assembly has a wafer-probe input port 116 and a waveguide flange 115 output port. What is needed are s-parameters measured using the VNA 110, connected with the device using waveguide transmission lines 113 and 113A and adapter 115A-118 between points 118 and 115 as a function of the tuning probe positions. The calibration executes in two phases: in a first phase the VNA is calibrated using waveguide standards between the waveguide flanges 115 and 115A and then a TRL calibration at wafer-probe level 118 is executed; this TRL calibration on wafer-probe level yields s-parameters of the waveguide-wafer-probe adapter between 115A and 118 (including wafer-probe 117), which is then de-embedded from the overall waveguide calibration between waveguide flanges 115 and 115A to reveal the s-parameters of the wafer-probe 116, tuner to waveguide flange 115 assembly.

Figure 7:
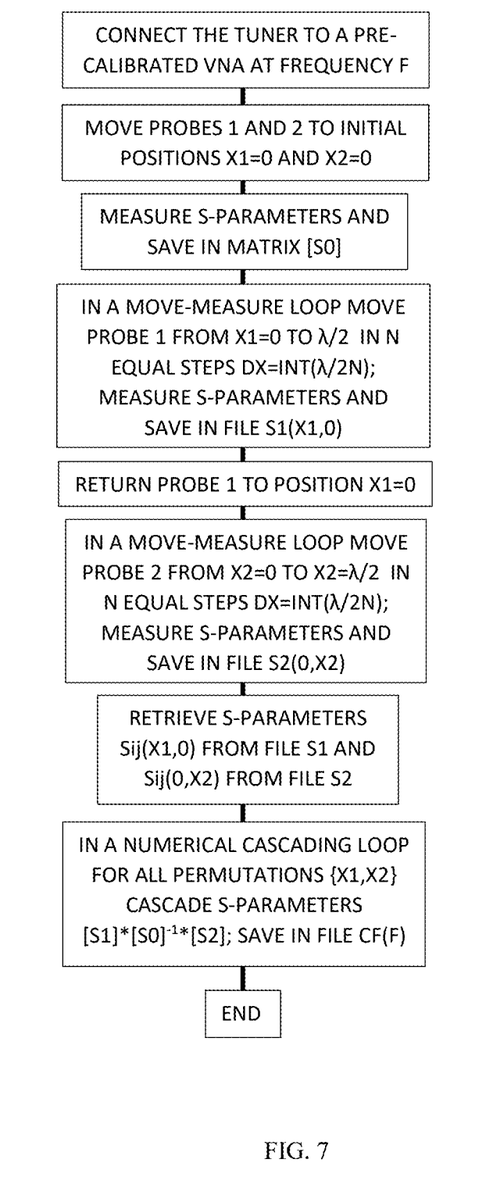
FIG. 7 depicts the tuner calibration flow-chart.

The tuner calibration procedure executes as follows (FIG. 7): The WG2WP adapter is connected to a pre-calibrated vector network analyzer (VNA): the two back to back WG2WP adapters (115A-118) and (118-115) are inserted between the two waveguide VNA ports (115 and 115A), the WG2WP adapter (115A-118), which does not include the tuning probes, is de-embedded from the VNA waveguide calibration and the two tuning probes are placed to initial positions: tuning probe #1 at X1=0 and tuning probe #2 at X2=0; then scattering (s-) parameters are measured and saved in an init matrix [S0]; then, in a first measurement loop, tuning probe #1 is moved in a number of N (typically 100) steps ΔX=(int)(XMAX/N) from X1=0 to X1=XMAX and s-parameters are measured and saved in a matrix [S1]=[S(X1,0)] containing 4 sets of two-port s-parameters Sij(X1,0). In a next measurement loop tuning probe #1 is returned to its initial position X1=0 and probe #2 is moved from X2=0 to XMAX in ΔX steps and s-parameters are measured and saved in a matrix [S2]=[S(0, X2)]. The total data are saved in data files S1 and S2 comprising N sets of s-parameters each. By the way, dividing the tuning probe travel to the same number of equal steps is not mandatory. The calibration method and the tuning method work also with different values, but, since the tuning probes have the same function and the frequency is the same, it is a matter of simplicity and convenience using the same values.

In a next step the hitherto measured calibration data of the individual tuning probes are used to generate the tuner calibration file as follows: for all X1, X2 permutations, symbolized as {X1,X2}, cascade (i.e., convert to transfer or ABCD T-parameters, multiply and convert back to s-parameters) the s-parameter matrices [S1], [S2] and [S0] as follows: [S1]*[S0]$^{-1}$*[S2] and save in a tuner calibration file C(F); the s-parameter data in file C(F) include sets of WG2WP adapter s-parameters between the wafer-probe pins 109 and the waveguide flange 109A for all N$^2$ permutations of X1 and X2 positions every ΔX=(int)(XMAX/N) steps.

Figure 8:
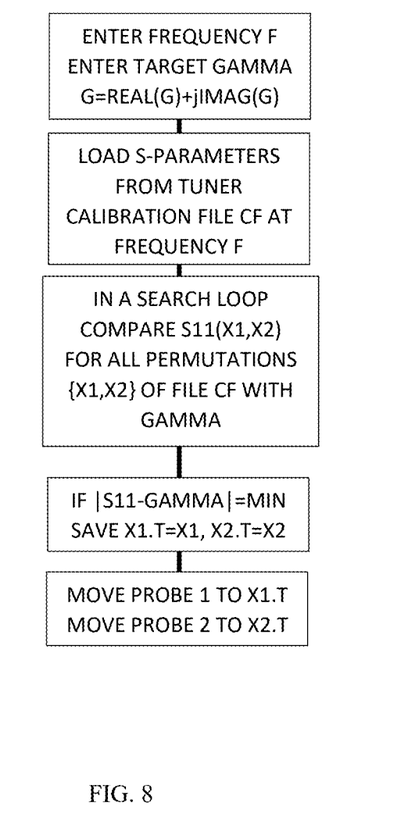
FIG. 8 depicts the impedance synthesis flow-chart.
Figure 9:
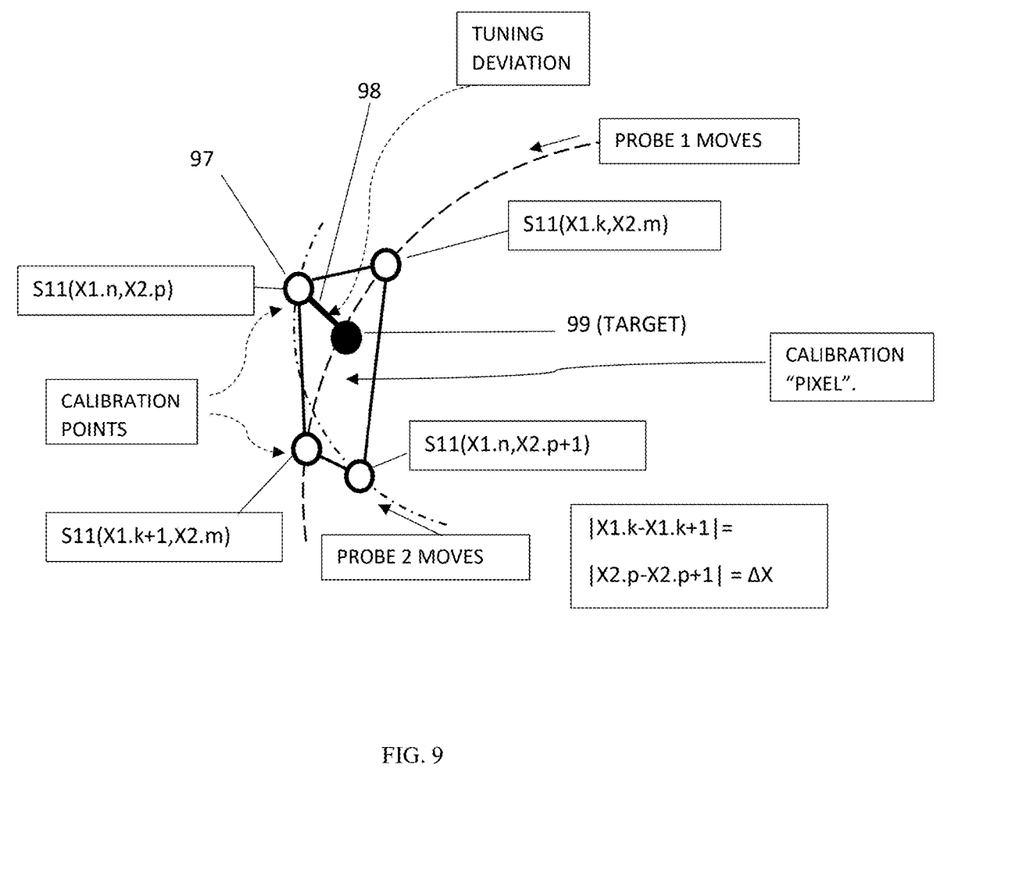
FIG. 9 depicts capturing a TARGET reflection factor inside a calibration "pixel".

Tuning (FIG. 9) is the procedure of synthesizing a TARGET reflection factor using the tuning probes of the calibrated WG2WP adapter, i.e., determining the best tuning probe positions X1, X2 that create a desired reflection factor 99 at the wafer-probe pins, facing the DUT (see tuning algorithm in FIG. 8 and pixel TARGET capturing details in FIG. 9). Tuning accuracy is defined as the vector difference 98 between the user-defined target reflection factor 99 and the closest synthesized calibration point 97. Assuming the tuner is calibrated at 100×100=10,000 settings (X1, X2): in a first rough approximation, on the Smith chart with a radius of 1 having a surface of π, the average size of each pixel 106 is π/10$^4$ and, in a worst case scenario, as shown in FIG. 6, item 99, if a target is in the center of a contour defined by the surrounding pixel (four calibrated points), the possible error, i.e., the logarithmic (in dB) difference of the closest calibrated point from the target is 20 log(sqrt(π/2)*10$^{-2}$)≈−38 dB; in this case tuning is a simple search through the data points vector S11(X1,X2) of the calibration file C(F) using an error function EF=|TARGET-S11| to minimize. This search could use optimized searching Real(S11) and Imag (S11) separately and should not last more than a few milliseconds. If the accuracy of −38 dB seems too coarse, then the number of calibrated points could be increased to 150 or 200 per axis with, still reasonable, calibration time and reach accuracies of 20 log (sqrt(π/2)/3*10$^{-2}$)≈−41 dB or 20 log (sqrt(π/(2)/4*10$^{-2}$)≈−44 dB etc. Even if every doubling of the number of horizontal steps doubles the, already inherently low, calibration time, it increases the worst-case accuracy by at least 6 dB.

Obvious alternative embodiments of the presented embodiment of a load pull tuner-quarter circle waveguide-to-wafer-probe (WG2WP) adapter assembly with two fixed-penetration tuning probes and associated calibration and tuning methods shall not impede on the core idea of the present invention.

What is claimed is:

1. A load pull tuner-waveguide-to-wafer-probe adapter assembly comprising:
   a partly slotted quarter-circle waveguide-to-wafer-probe adapter, and two remotely controlled reflective tuning probes, a first tuning probe and a second tuning probe, wherein
   the partly slotted waveguide-to-wafer-probe adapter comprises:
   a rectangular waveguide transmission line having a top and a bottom broad wall and two narrow side walls, forming a 90-degree waveguide arc and being connected on one end to a waveguide flange and on the other end to a wafer-probe head;
   and wherein
   the 90-degree waveguide arc includes two slots, centered on the top broad wall along the waveguide, a first slot towards the wafer-probe head and a second slot towards the waveguide flange, each said slot being at least one half of a wavelength long at a minimum frequency of operation of the load pull tuner;
   and wherein
   two mobile carriages, a first mobile carriage and a second mobile carriage slide along the top broad wall of the waveguide arc, moved by a radial arm, which rotates around a virtual center of the waveguide arc and is controlled using stepper motors and appropriate gear;
   and wherein
   the first tuning probe is attached to the first mobile carriage and the second tuning probe is attached to the second mobile carriage, each said tuning probe being inserted contactless at fixed penetration into the associated slots,
   and wherein
   the mobile carriages are spring-loaded towards the broad wall of the waveguide arc and can tilt away from the waveguide broad wall, when hitting a stop, and lift the tuning probes out of the waveguide slots.

2. The load pull tuner-waveguide-to-wafer-probe adapter assembly of claim 1,
   wherein
   the tuning probes are, at least partly, metallized rods.

3. The load pull tuner-waveguide-to-wafer-probe adapter assembly of claim 1,
   wherein
   the tuning probes are, at least partly, metallized dielectric pellets.

4. The load pull tuner-waveguide-to-wafer-probe adapter assembly of claim 1,
   wherein
   the tuning probes are initialized to withdrawal positions by moving the carriages beyond the stops, causing them to tilt away from the top waveguide broad wall, lifting the tuning probes out of the waveguide slots and defining associated initialization (withdrawal) positions X1=0 and X2=0;
   and wherein
   the first carriage moves the first tuning probe to a position X1 away from the initialization position X1=0 and the second carriage moves the second tuning probe to a position X2 away from the initialization position X2=0.

5. The load pull tuner-waveguide-to-wafer-probe adapter assembly of claim 1,
   wherein
   the carriages are moved by remotely controlled stepper motors, appropriate gear and motor control software running in a PC controller.

6. The load pull tuner-waveguide-to-wafer-probe adapter assembly of claim 1,
   wherein
   the tuning probes are inserted and moving inside the slots without contacting the waveguide walls.

\* \* \* \* \*